US010630190B2

(12) United States Patent
Tayebi et al.

(10) Patent No.: US 10,630,190 B2
(45) Date of Patent: Apr. 21, 2020

(54) MULTI-INPUT SINGLE-RESONANT TANK LLC CONVERTER

(71) Applicant: UNIVERSITY OF CENTRAL FLORIDA RESEARCH FOUNDATION, INC., Orlando, FL (US)

(72) Inventors: Seyed-Milad Tayebi, Orlando, FL (US); Issa Batarseh, Orlando, FL (US); Haibing Hu, Nanjing (CN)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 16/536,911

(22) Filed: Aug. 9, 2019

(65) Prior Publication Data

US 2020/0052604 A1    Feb. 13, 2020

Related U.S. Application Data

(60) Provisional application No. 62/718,119, filed on Aug. 13, 2018.

(51) Int. Cl.
*G05F 1/67* (2006.01)
*H02M 3/335* (2006.01)
*H01L 31/042* (2014.01)

(52) U.S. Cl.
CPC ...... *H02M 3/33592* (2013.01); *H01L 31/042* (2013.01); *G05F 1/67* (2013.01); *H02M 3/33523* (2013.01)

(58) Field of Classification Search
CPC .............. G05F 1/67; H02M 3/33523

USPC ........................ 323/906; 363/21.02, 21.03
See application file for complete search history.

(56) References Cited

U.S. PATENT DOCUMENTS

| | | | | |
|---|---|---|---|---|
| 8,193,788 | B2* | 6/2012 | Chapman | H02J 3/383 |
| | | | | 323/259 |
| 8,901,411 | B2* | 12/2014 | Liu | H02J 3/18 |
| | | | | 136/244 |
| 9,667,157 | B1* | 5/2017 | Dong | H02M 3/33584 |
| 2010/0253151 | A1* | 10/2010 | Gerhardinger | G05F 1/67 |
| | | | | 307/82 |
| 2011/0043160 | A1* | 2/2011 | Serban | G05F 1/67 |
| | | | | 320/101 |
| 2012/0126624 | A1* | 5/2012 | Hester | G05F 1/67 |
| | | | | 307/77 |

(Continued)

*Primary Examiner* — Gary A Nash
(74) *Attorney, Agent, or Firm* — Fleit Intellectual Property Law; Thomas S. Grzesik

(57) ABSTRACT

A multi-input power DC-DC converter includes a first and second bridge circuit for receiving power from a first and second electric power source. The first bridge circuit includes a first power switches with a first switch output node in between, and a second bridge circuit for receiving power from a second electric power source including second power switches with a second switch output node in between. At least one of the first and second electric power source is a photovoltaic (PV) panel. A single LLC resonant tank coupled to both the first and second output node is configured together with a transformer including a secondary winding and a primary winding that provides a magnetizing inductance which provides a second inductance for the single LLC resonant tank. A rectifier is coupled to the secondary winding.

16 Claims, 13 Drawing Sheets

(56) References Cited

U.S. PATENT DOCUMENTS

| | | | |
|---|---|---|---|
| 2015/0069840 A1* | 3/2015 | Teo | G05F 1/67 |
| | | | 307/52 |
| 2016/0049791 A1* | 2/2016 | Johnston | H02J 3/385 |
| | | | 361/104 |
| 2016/0294189 A1* | 10/2016 | Uno | G05F 1/67 |
| 2017/0063251 A1* | 3/2017 | Ye | H02M 3/33576 |

* cited by examiner

MULTI-INPUT SINGLE-RESONANT TANK LLC CONVERTER

CROSS REFERENCE TO RELATED APPLICATIONS

This application claims the benefit of Provisional Application Ser. No. 62/718,119, entitled "MULTI-INPUT SINGLE-RESONANT TANK LLC CONVERTER" filed Aug. 13, 2018, which is herein incorporated by reference in its entirety.

FIELD

Disclosed embodiments relate to resonant tank LLC power converters.

BACKGROUND

A microinverter is a plug-and-play device used in photovoltaics (PVs) that converts direct current (DC) generated by a single solar panel (or solar module) to alternating current (AC). Microinverters are gaining popularity over their string inverter counterparts in PV-based power generation systems due to maximized energy harvesting, high system reliability, modularity, and simple and flexible installation. Microinverters can be used in commercial buildings, residential rooftops, electric poles, and a variety of stand-alone applications.

In PV-based microinverter systems cost is generally a top priority, since it is a disadvantage when compared to the cost per watt of centralized and string inverters. Much of this cost is driven by the need for a higher number of circuit components in a microinverter-based PV system to maintain the DC/AC inversion functionalities as compared to centralized and string inverters. A conventional two-stage microinverter topology for connection to a power grid includes a front-end DC/DC converter capacitively coupled to a DC/AC inverter that has its output connected to the power grid. For example, a half-bridge converter topology is a common type of DC-DC converter that, like flyback and forward converters, can supply an output voltage either higher or lower than the input voltage, and provide electrical isolation via a transformer.

SUMMARY

This Summary is provided to introduce a brief selection of disclosed concepts in a simplified form that are further described below in the Detailed Description including the drawings provided. This Summary is not intended to limit the claimed subject matter's scope.

In order to reduce the cost and improve the power density of power converter systems, it is recognized herein to be advantageous to design a DC-DC converter capable of interfacing to more than one power source without increasing the number of circuit components. In fully isolated DC-DC converters, a multi-winding transformer is generally required and each port has its own set of power switches or rectifiers. Therefore, a high number of power switches and circuit components are required which increases the converter's volume and its cost while reducing its reliability. The output voltage of PV panels varies with manufacturer as well as with the isolation. Therefore, to be compatible with the variety of available PV panels, it is needed to develop a new DC-DC converter capable of operating over a wide range of PV voltages, while achieving high power conversion efficiency and high power density. One of the requirements for a DC/DC converter is that it needs to boost the relatively low input voltage level received from a PV panel or other power source such as a battery to a higher voltage level suitable for the DC/AC inverter stage.

In this Disclosure, a believed to be new multi-input LLC resonant DC-DC converter topology is described having only a single LLC resonant tank that includes an inductor, a capacitor and the magnetizing inductance of a transformer, where bridge circuits are interfaced to receive power from two or more electrical power sources selected from PV panels and external batteries. One example topology is a dual-input LLC resonant DC-DC converter that interfaces with two PV panels, and another example topology is a quad (4) input LLC resonant DC-DC converter that interfaces with four PV panels. In the case of PV panels, power from each PV panel can be controlled by disclosed pulse width modulation (PWM) phase shift control applied to switches of the bridge circuits which enables each PV source to independently implement maximum power point tracking (MPPT). A rectifier is coupled to the secondary side of the transformer to provide a DC output.

Disclosed aspects include a multi-input power DC-DC converter comprising a first bridge circuit configured for receiving power from a first electric power source, the first bridge circuit comprising a first pair of power switches with a first switch output node (node A) in between, and a second bridge circuit configured for receiving power from a second electric power source comprising a second pair of power switches with a second switch output node (node B) in between; wherein at least one of the first electric power source and second electric power source comprise a photovoltaic (PV) panel. A single LLC resonant tank coupled to both node A and node B including a first inductor ($L_r$) and a capacitor (Cr) configured together with a transformer comprising a secondary winding and a primary winding that provides a magnetizing inductance which provides a second inductance (Lm) for the single LLC resonant tank, wherein at least two of the $L_r$, the $C_r$, and the $L_m$ of the single LLC resonant tank are coupled between node A and node B. A rectifier is coupled to the secondary side of the transformer to provide a DC output.

DETAILED DESCRIPTION

Figure 1A:
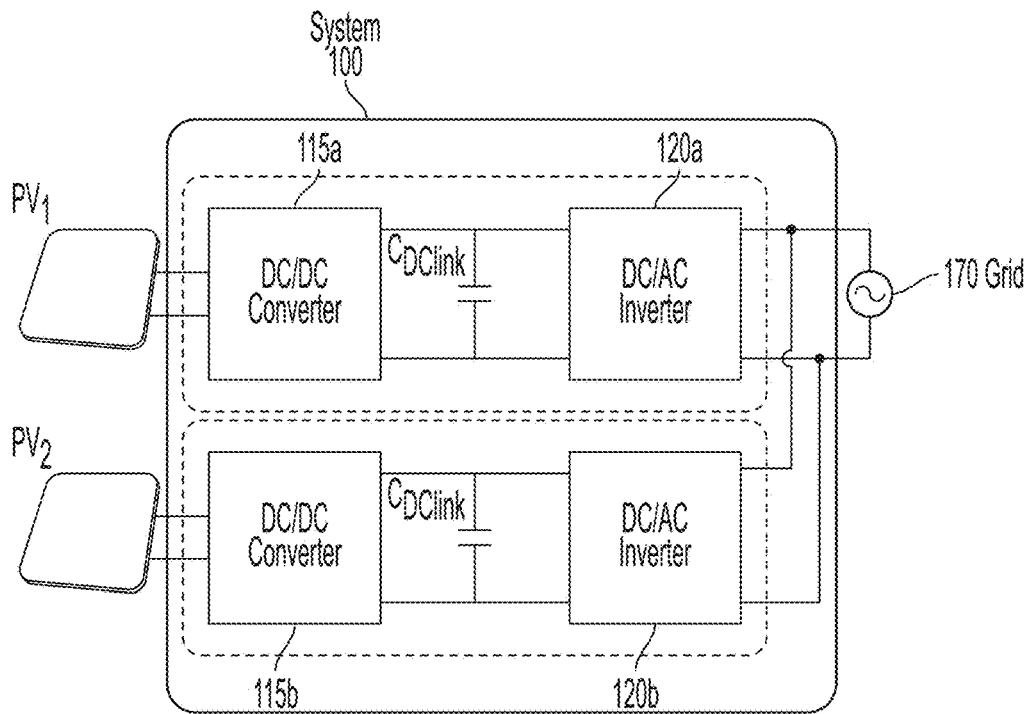
FIG. 1A shows a conventional DC-DC converter architecture with two PV panels, each PV panel connected to a dedicated DC/DC converter capacitively coupled to a dedicated DC/AC inverter to enable an MPPT controller (not shown) to provide MPPT for each PV panel.

Disclosed embodiments are described with reference to the attached figures, wherein like reference numerals, are used throughout the figures to designate similar or equivalent elements. The figures are not drawn to scale and they are provided merely to illustrate aspects disclosed herein. Several disclosed aspects are described below with reference to example applications for illustration. It should be understood that numerous specific details, relationships, and methods are set forth to provide a full understanding of the embodiments disclosed herein.

One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. Disclosed embodiments are not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Disclosed multi-input LLC resonant DC-DC converters use a single LLC resonant tank to transfer energy and perform power conversion received from multiple power sources without the need for any additional circuit components. Zero-voltage-switching (ZVS) is generally achieved in all power switches in the DC/DC converter and the voltage stress across the power switches is thus low and does not exceed the input PV or battery source voltage. Disclosed multi-input single LLC resonant tank DC-DC converters have a partially isolated topology, where for a dual-input LLC resonant DC-DC converter the two power ports share a common ground and are isolated from the output port. An advantage of this disclosed DC-DC converter topology is its simpler and flexible circuit structure and lower cost when compared to a plurality of conventional single-input DC-DC converters. The disclosed topology for a dual-input LLC resonant DC-DC converter only needs four power switches and a single resonant tank resulting in a reduced component count, and thus a lower cost.

In a PV converter architecture where isolation is required, an LLC resonant DC-DC converter is a common topology due to its high efficiency. FIG. 1A shows one known LLC-based converter system 100 with two PV panels shown as $PV_1$ and $PV_2$ (also called PV modules that have a plurality of PV cells connected in series to provide a working voltage of generally between about 25 and 50 volts), where the output of each PV panel is connected to an isolated DC-DC converter 115a and 115b. A conventional MPPT controller (not shown) provides independent MPPT for each PV source.

MPPT is known in the art to be an algorithm which is included in charge controllers used for extracting maximum available power from a PV module(s) under the particular current conditions. The voltage at which PV source can produce maximum power is called maximum power point (or peak power voltage), and the maximum power varies with the intensity of the solar radiation, ambient temperature, and the solar cell temperature. An MPPT solar charge controller is a charge controller embedded with a MPPT algorithm. MPPT checks the output of PV source, generally compares it to a fixed voltage level and then fixes what is the best power that PV source can produce and converts the voltage to the best voltage in order to get maximum power output.

The energy harvested from the respective PV sources is transferred to the respective DC/AC inverter stages 120a, 120b, through separate DC/DC converters 115a, 115b. The DC/DC converters 115a, 115b shown in FIG. 1A may each be half-bridge circuits, or more generally any DC/DC converter topology including full-bridge or half-bridge configurations. A power grid 170 receives the AC output from the DC/AC inverter stages 120a, 120b. The system 100 having a dedicated DC/DC converter 115a, 115b and a dedicated DC/AC inverter stage 120a, 120b for each PV is recognized herein to adversely impact cost, system efficiency, and reliability.

Figure 1B:
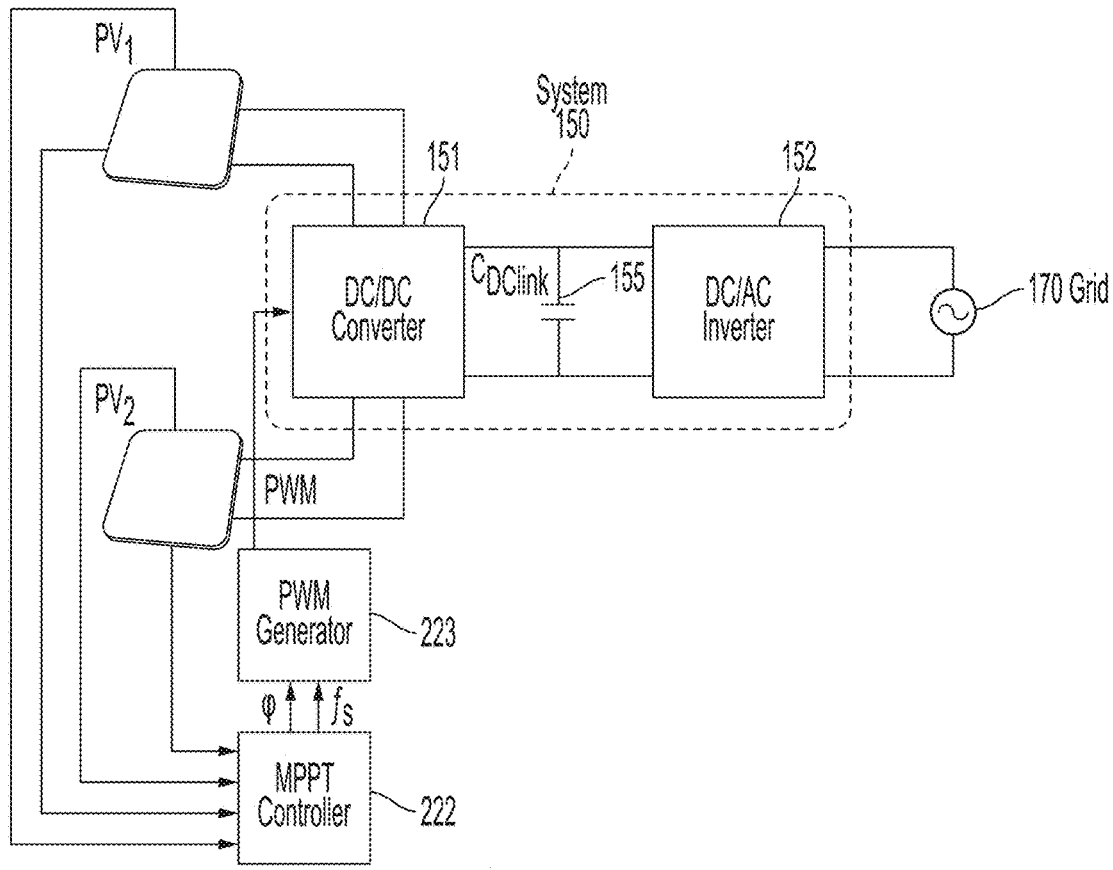
FIG. 1B shows a block diagram representation of a disclosed dual-input single resonant tank LLC DC-DC converter which interfaces with two PV panels, and includes an MPPT controller coupled to a PWM generator for implementing disclosed PWM phase shift control to provide MPPT independently for each PV panel, shown connected to a single DC/AC inverter.
Figure 2A:
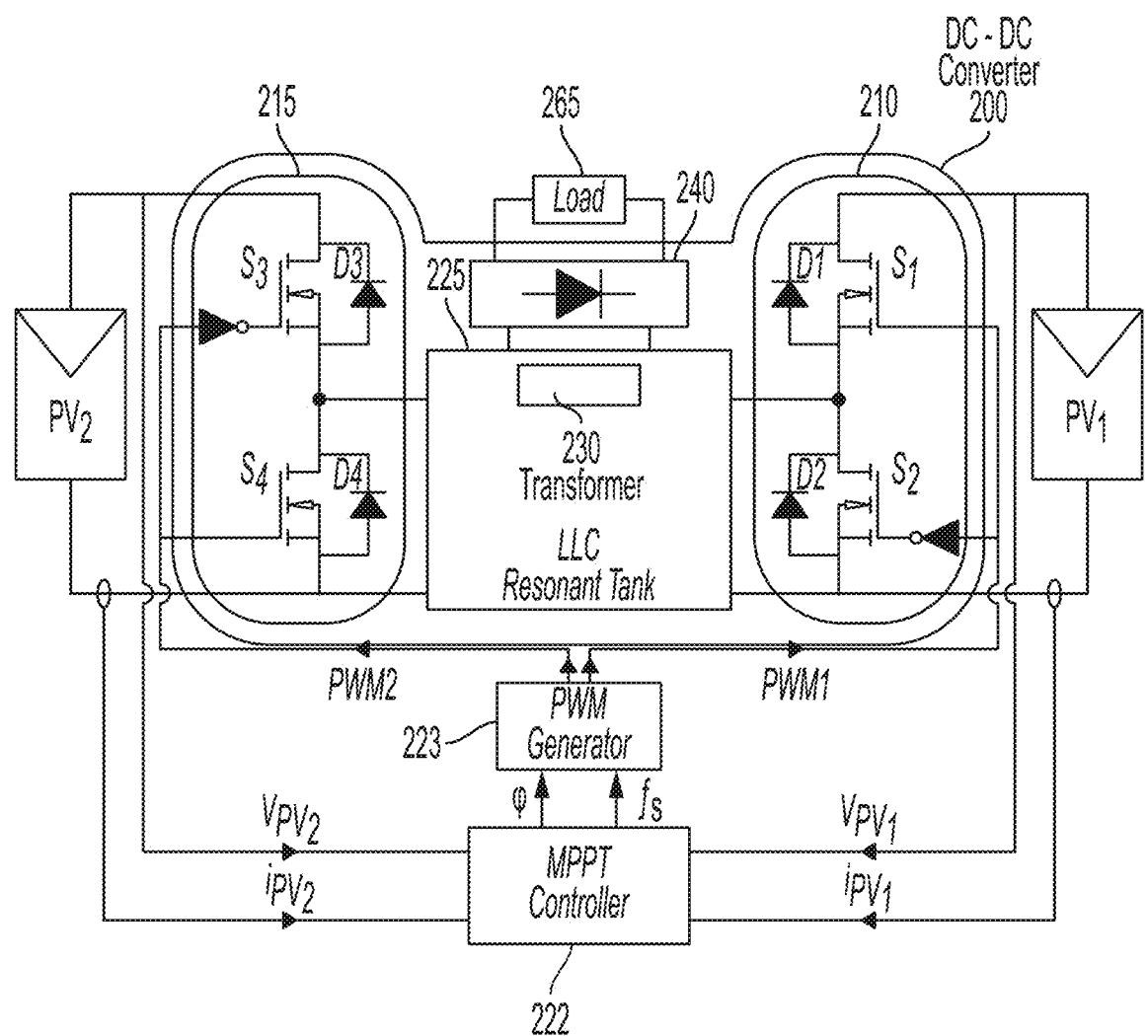
FIG. 2A shows an example circuit diagram implementation for the dual-input single resonant tank DC-DC converter shown in FIG. 1B that includes an MPPT controller and PWM generator.

FIG. 1B shows a block diagram representation for the system 150 comprising a disclosed dual-input LLC DC-DC converter 151 and a single DC/AC inverter 152, where the DC/DC converter 151 interfaces with two PV panels shown as $PV_1$ and $PV_2$. There is also a MPPT controller 222 coupled to a PWM generator 223 for implementing disclosed PWM phase shift control to independently provide MPPT for each PV panel $PV_1$ and $PV_2$. The DC/DC converter 151 may comprise a first and a second half-bridge circuits such as shown in FIG. 2A described below or another DC/DC converter topology. The LLC topology for the DC/AC inverter 152 is recognized herein a topology that enables a single-input converter that can operate with either half-bridge or full-bridge DC/DC converter 151 configurations. The MPPT controller 222 is coupled to receive the voltage generated across and the current provided by each of $PV_1$ and $PV_2$.

The MPPT controller 222 implements a disclosed MPPT algorithm that determines a PWM phase shift (Φ) and the switching frequency (fs) to be used by the PWM generator 223 which outputs a PWM signal for the DC/DC converter 151 associated with each PV which is applied to. The PWM generator 223 outputs two pairs of PWM, one pair of PWM signals for the two switches connected to $PV_1$, and another pair of PWM signals for the two switches connected to $PV_2$. These two pair of PWM signals can be phase shifted. The power switches (power switches not shown in FIG. 1B, but see FIG. 2A described below) implement independent MPPT control of the respective PV's. In the Experimental results section described below, MPPT for each PV panel is implemented by a Φ applied between the top power switches S1 and S3 in respective DC-DC converters for $PV_1$ and $PV_2$.

The energy harvested from both $PV_1$ and $PV_2$ is transferred through only one DC/DC converter 151 and one DC/AC inverter 152 that is coupled together by a DC link capacitor shown as CDClink. This disclosed dual-input LLC DC-DC converter 151 significantly reduces the number of circuit components compared to the known system 100 shown in FIG. 1A which has separate DC/DC converters 115a, 115b and separate DC/AC inverters 120a, 120b, for each PV panel, thus separate microinverters for each PV panel. In contrast for disclosed DC-DC converters using disclosed PWM phase shift control, two PV panels can be connected to only one disclosed DC/DC converter 151 and one DC/AC inverter 152. Therefore, in general, instead of using two microinverters for two PV panels, only one microinverter will be used with disclosed topologies and control, thereby improving system reliability and reducing the cost.

FIG. 2A shows first example circuit diagram implementation for the disclosed dual-input single resonant tank DC-DC converter 200 shown in FIG. 1B as 151 that includes an MPPT controller 222 and PWM generator (or modulator) 223 which provides a control structure for $PV_1$ and $PV_2$. Single resonant tank DC-DC converter 200 is shown by example comprising a half-bridge circuit 215 shown associated with $PV_2$ and a half-bridge circuit 220 shown associated with $PV_1$, where the half-bridge circuits are both coupled to a single LLC resonant tank 225 that functions as the DC/AC converter. An output of the single LLC resonant tank 225 is shown coupled to a bridge rectifier 240 which converts the AC signal received from the single LLC resonant tank to 225 to DC. A load 265 is shown across terminals of the bridge rectifier 240.

MPPT controller 222 is coupled to measure the voltage and current from each PV panel to calculate the available input PV power. The switching frequency fs and Φ are determined by the MPPT controller 222. The fs is selected based on the total available input power from the two PV panels, and the Φ selected between the PV panels is a function of the power mismatch between the two PV panels. The PWM generator 223 then generates two PWM signals, shown as PWM1 and PWM2, one PWM signal shown for each of the two half-bridge circuit 215 and 220. Half-bridge DC/DC circuit 215 comprises $S_3$ and $S_4$, while half-bridge DC/DC circuit 210 comprises $S_1$ and $S_2$. The parasitic body diodes for the respective switches $S_1$ to $S_4$ are shown as $D_1$ to $D4$. The capacitors C1 and C2 are optionally shown as being part in FIG. 2C as part of the respective half-bridge circuits 210, 215.

The PWM signal applied to each half-bridge circuit 215, 220 may be modulated in complementary mode with a 50% duty cycle. Depending on the power mismatch between the PV panels 1 and 2, these PWM signals may be phase shifted Φ relative to one another either positively or negatively.

Figure 2B:
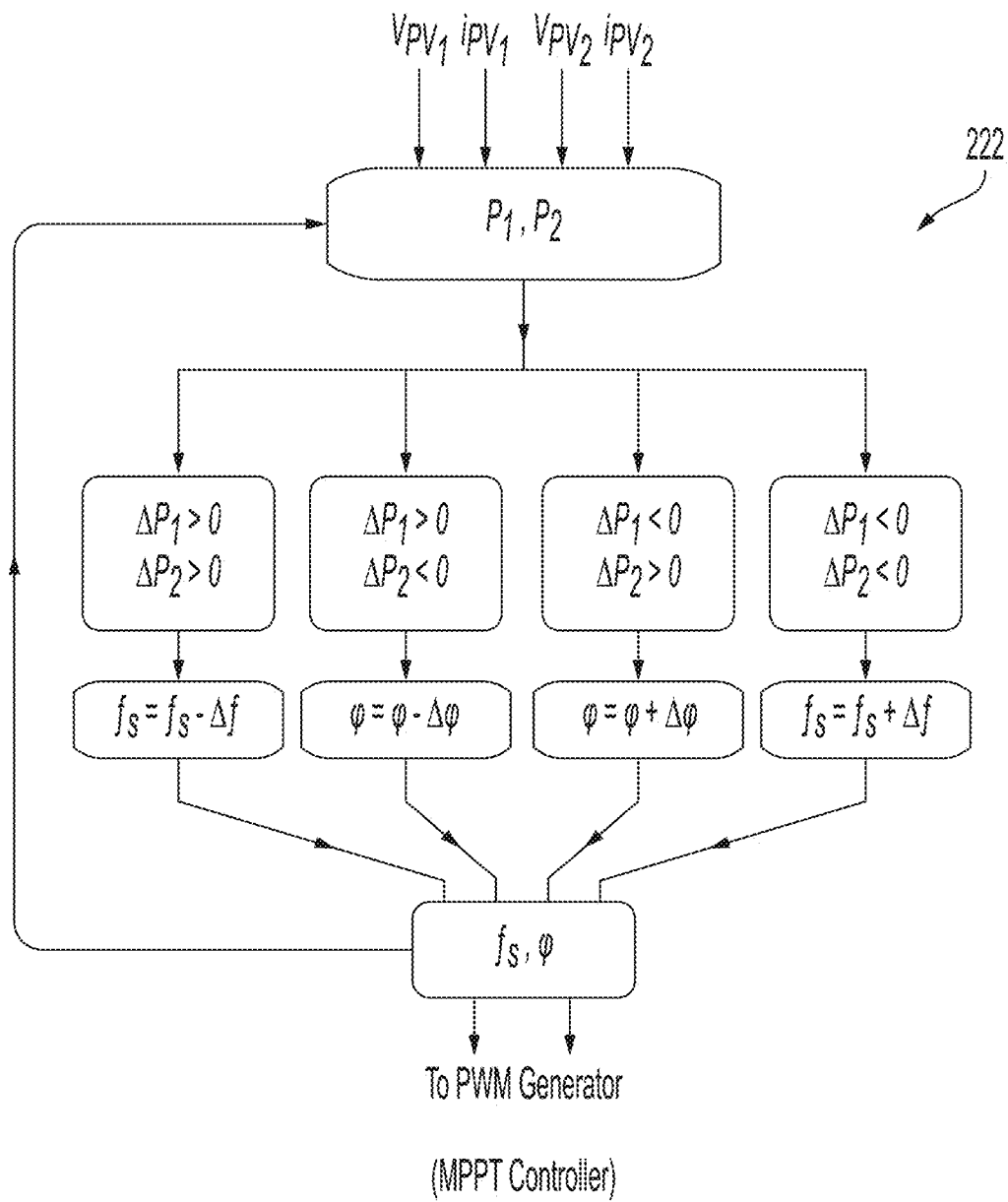
FIG. 2B depicts the working of an example MPPT controller for controlling dual PV sources.

Since the MPPT controller 222 is generally operating at much lower frequency (generally tens of hertz (Hz)) as compared to the PWM switching frequency (generally hundreds of kilohertz (kHz)), small signal analysis was not performed. However, an iterative method was used implement MPPT using fs and Φ. This iterative method can be based on a perturb and observe algorithm that constantly measures the input power received from $PV_1$ and from $PV_2$. As shown in FIG. 2B which depicts the working of an example MPPT controller for dual PV sources shown as MPPT controller 222', when power from both PV sources is either increasing or decreasing, the MPPT controller 222' only adjusts fs to locate the maximum power point which is similar to a typical MPPT controller used in a conventional PV microinverter.

Power is shown by P1 and P2 representing power received from $PV_1$ and $PV_2$, respectively. However, when there is power mismatch between the two PV sources (P1 not equal to P2), a Φ will be introduced along with fs to independently implement MPPT for the PV's. During a dynamic change in power, the MPPT controller 222' generally iteratively adjusts fs and Φ in several steps to locate the maximum power point. The MPPT algorithm is designed so that only one variable, either fs or Φ, is needed to be modified during each sampling period. This approach was implemented in a prototype and verified to achieve independent MPPT for each PV source as described below in the Examples section.

Figure 2C:
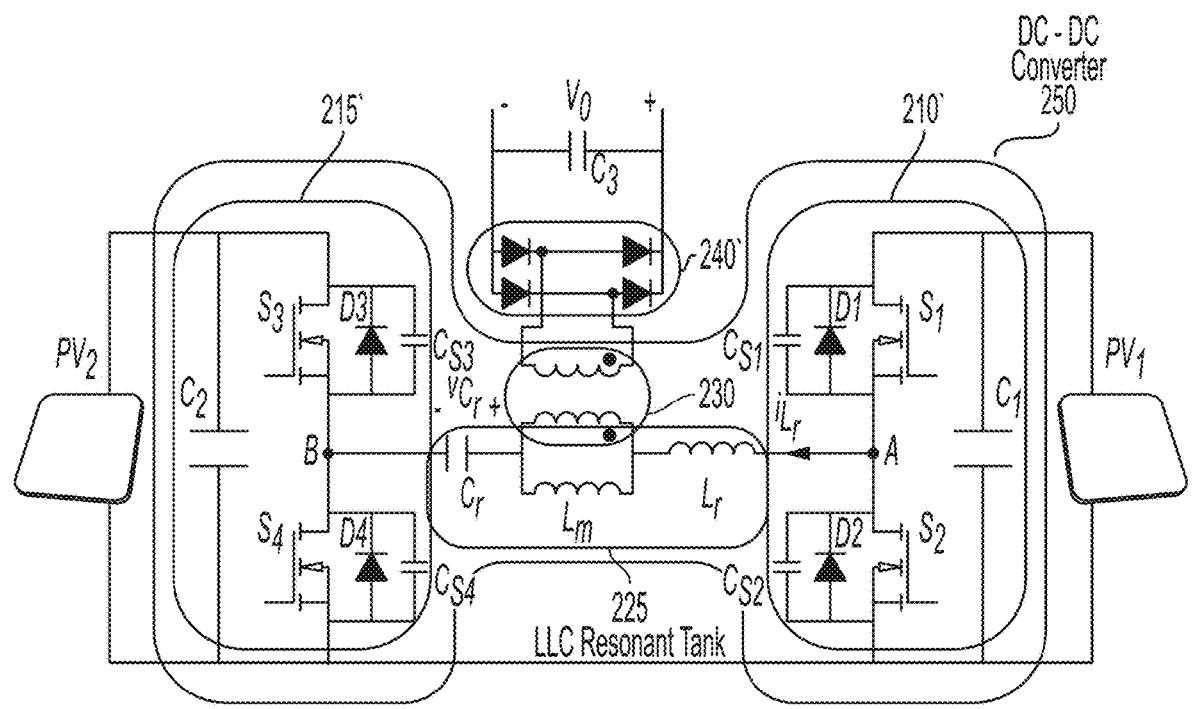
FIG. 2C shows a second example circuit diagram implementation for the disclosed dual-input single resonant tank DC-DC converter shown in FIG. 1B.

FIG. 2C shows a circuit diagram for a dual-input LLC DC-DC converter 250 for an implementation for the dual-input LLC DC-DC converter 151 shown in FIG. 1B having a single LLC resonant tank 225. Each PV source $PV_1$ and $PV_2$ is connected to a separate half-bridge circuit shown as 210' including $S_1$-$S_2$ and 215' including $S_3$ and $S_4$ so that the LLC resonant tank 225 can operate in both a half-bridge and a full-bridge configuration.

$PV_1$ and $PV_2$ are thus connected to power switches $S_1$-$S_2$ and $S_3$-$S_4$, respectively, with a common ground at the low side of S2 and S4. S1 to S4 are shown as metal-oxide-semiconductor field-effect transistor (MOSFET) power switches. However, other power switch types may also be used, such as insulated gate bipolar transistor (IGBT) switches.

The LLC resonant tank 225 comprises a first inductor Lr, a capacitor Cr, and a second inductor Lm that represents the magnetizing inductance of the transformer 230 which is modeled as an inductor having an inductance Lm. A transformer has only one magnetizing inductor, and it can be placed in either the primary side or the secondary side. Generally, it is placed in the primary side as shown. In this configuration Cr is on the primary winding side of the transformer 230. The transformer's 230 turns ratio is 1:n, so that it is a step-up transformer, and its secondary side is connected to the DC link capacitor shown as $C_3$ through a bridge rectifier 240'. Capacitors C1, C2 and C3 are assumed to be large enough (generally tens of microfarads, such as 50-100 microfarads) so that they maintain essentially constant voltages. During operation of the dual-input LLC DC-DC converter 250 the switches, $S_1$ to $S_4$, are controlled by a MPPT controller coupled to a PWM generator (see MPPT controller 222 coupled to a PWM generator 223 in FIG. 2A), where the PWM generator comprises a gate driver for generating PWM signals for implementing DC-DC converter operation in four different states (shown as P, B, PB and N) as follows:

P: $S_1$ and $S_4$, ON (so that only $PV_1$ is connected to provide power to Vo)

B: $S_2$ and $S_3$, ON (so that only $PV_2$ is connected to provide power to Vo)

PB: $S_1$ and $S_3$, ON (so that $PV_1$ and $PV_2$ are both connected to provide power to Vo)

N: $S_2$ and $S_4$, ON (so that neither PV source is connected to provide power to Vo)

Figure 3:
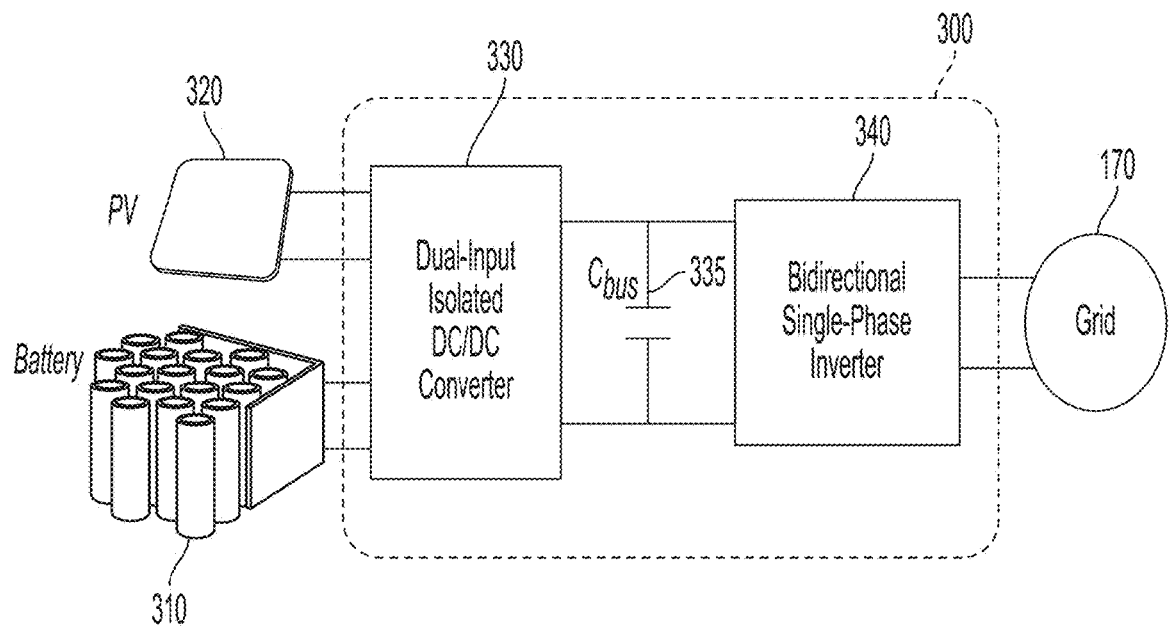
FIG. 3 shows a block diagram representation of an example system level configuration of a disclosed single resonant tank DC-DC converter.

FIG. 3 shows a block diagram representation of an example system 300 shown in a level configuration for a dual-input single resonant tank integrated DC-DC converter 330 shown coupled to a bidirectional single-phase inverter 340. The bidirectional single-phase inverter 340 can be a conventional inverter. Integrated is used here means configured on a print circuit board (PCB) and can be connected to both a PV source and a battery source. The dual input isolated DC/DC converter 330 has a disclosed architecture and is coupled to a bidirectional single-phase inverter 340 by a capacitor shown as $C_{bus}$ 335. The dual input isolated DC/DC converter 330 can comprise the half-bridge circuits 215' and 210' shown in FIG. 2C together with a single resonant tank (as a DC/AC converter), and the rectifier bridge (which is an AC/DC converter) on the secondary side of the transformer to provided DC output. The dual input isolated DC-DC converter 330 is for receiving DC power from a PV 320 and from a battery 310 and providing a DC output, and the inverter 340 is for converting the DC output received from the DC-DC converter 330 for providing single phase AC power to a power grid 170.

Figure 4:
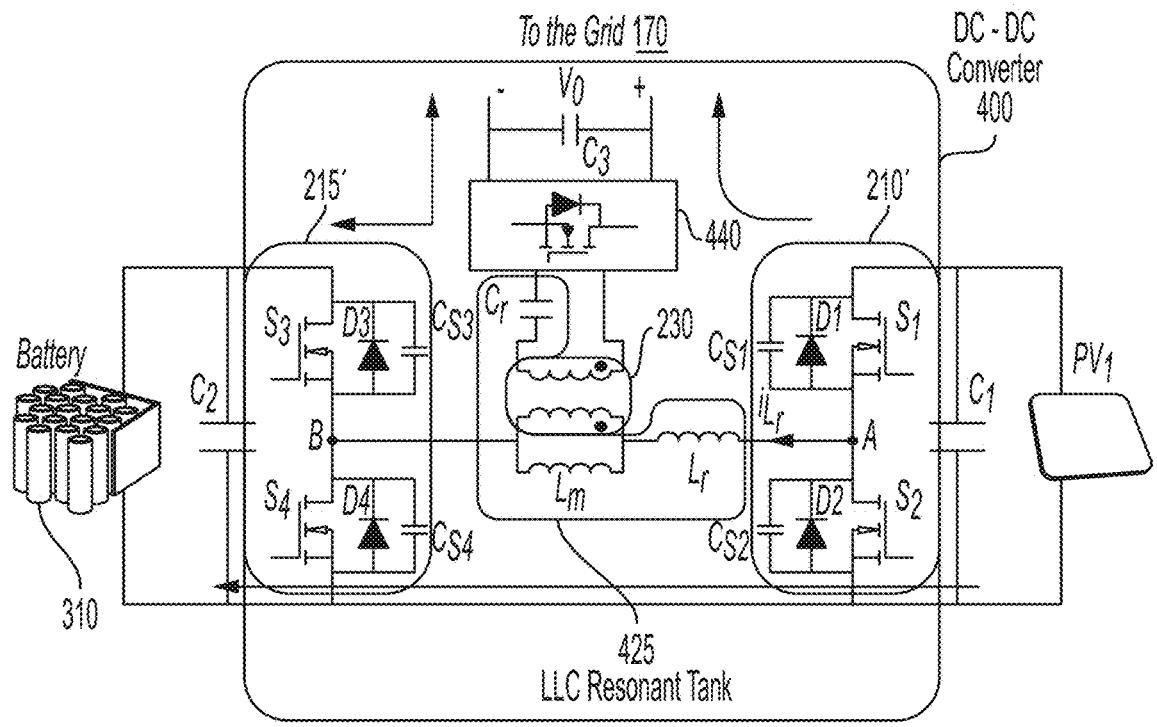
FIG. 4 shows an example circuit diagram for the dual-input single resonant tank LLC DC-DC converter shown in FIG. 3.

FIG. 4 is a circuit diagram for a disclosed DC-DC converter 400 for the dual-input single resonant tank DC-DC converter 330 shown in FIG. 3 that resembles the DC-DC converter shown in FIG. 2C, except the capacitor Cr shown in FIG. 2C is transferred to the secondary side of the transformer 230, and with $PV_2$ replaced by an external battery 310. Cr is coupled to a rectifier 440. This is another topology for PV-battery applications. When the battery 310 shown is charged by $PV_1$, there is thus no capacitors in the circuit path from $PV_1$ to the battery 310 which enables bidirectional power flow for the battery 310. The switches $S_1$ to $S_4$ are shown not only including their parasitic body diode shown as D1 to D4, but also their parasitic substrate capacitance shown as Cs1 to Cs4.

Figure 5A:
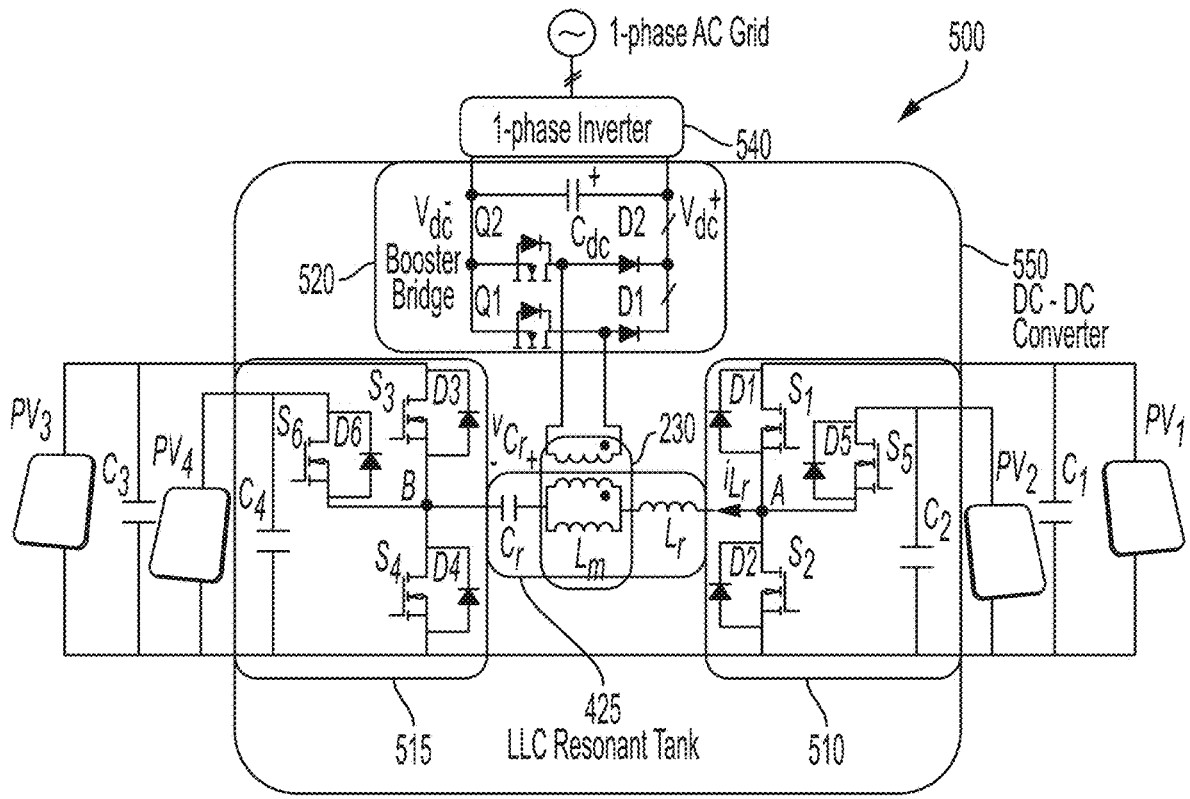
FIG. 5A shows a circuit diagram for a disclosed quad-input single resonant tank DC-DC converter having a single LLC resonant tank that includes a transformer coupled to a 1-phase inverter that provides an AC output.

FIG. 5A shows a circuit diagram for a system 500 including a disclosed quad PV-input DC-DC converter 550 comprising a single LLC resonant tank 425 that includes a transformer 230. The 500 includes 1-phase inverter 540 that is connected through a bridge booster 520 shown comprising transistors Q1 and Q2 and diodes D1' and D2', where the bridge booster 520 is coupled to the secondary side of the transformer 230 that outputs voltage boosted 1-phase power to an AC power grid. Although not shown in FIG. 5A, in a practical system there will be a disclosed MPPT controller and PWM generator described above that provides a control structure for $PV_1$ to $PV_4$.

The half-bridge 515 shown comprises $S_3$, $S_4$ and $S_6$ coupled to receive power from $PV_3$ and $PV_4$, and the half-bridge 510 comprises S1, S2, S5 is coupled to receive power from $PV_1$ and $PV_2$. Although switches S1, S3, S5, and S6 are shown as conventional single switches in FIG. 5A, the switches S1, S3, S5, and S6 can also comprise bidirectional power switches which means each bidirectional power switch includes 2 back to back switches.

Figure 5B:
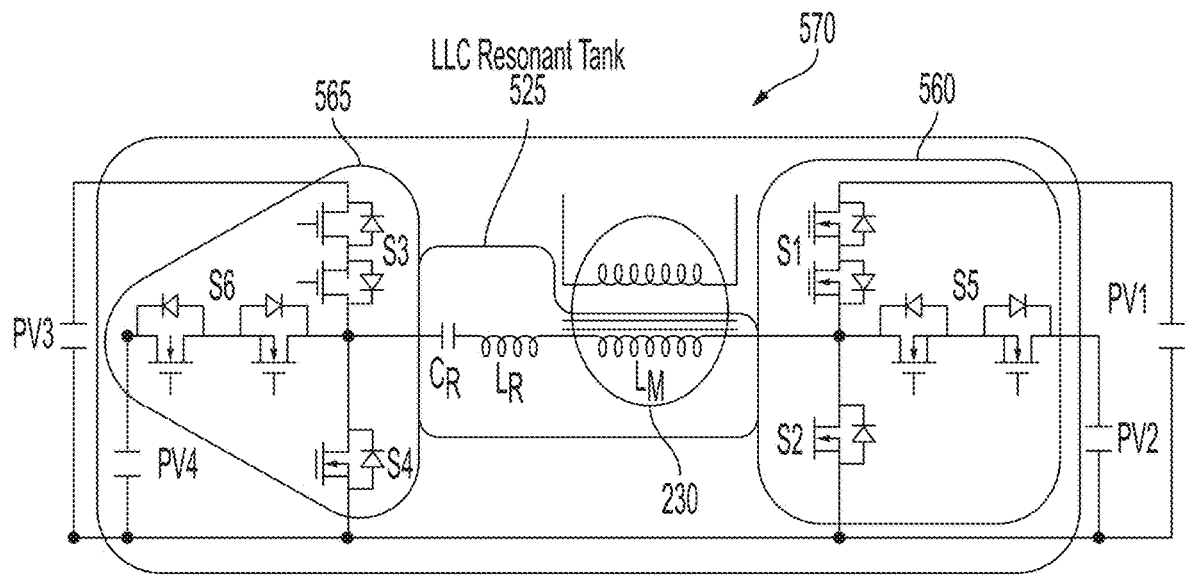
FIG. 5B shows a circuit diagram for a disclosed quad-input single resonant tank DC-DC converter having a single LLC resonant tank that includes a transformer that has some of its switches shown as bidirectional power switches.

FIG. 5B shows a circuit diagram for a disclosed quad-input single resonant tank DC-DC converter 570 having a single LLC resonant tank 525 that includes a transformer 230 that has some of its switches shown as S1, S3, S5, and S6 being bidirectional power switches. In operation the LLC resonant tank 525 needs to be charged by the four PV panels. Like the dual-input LLC DC-DC converter 550 shown in FIG. 5A, when $PV_1$ and $PV_3$ are generating power (charging the resonant tank 525), S1, S2, S3, and S4 are operating (on). Similarly, when $PV_2$ and $PV_4$ are charging the resonant tank 525, S5, S2, S6, and S4 are operating (on). A rectifier coupled to the secondary side of the transformer 230 is not shown.

Figure 5C:
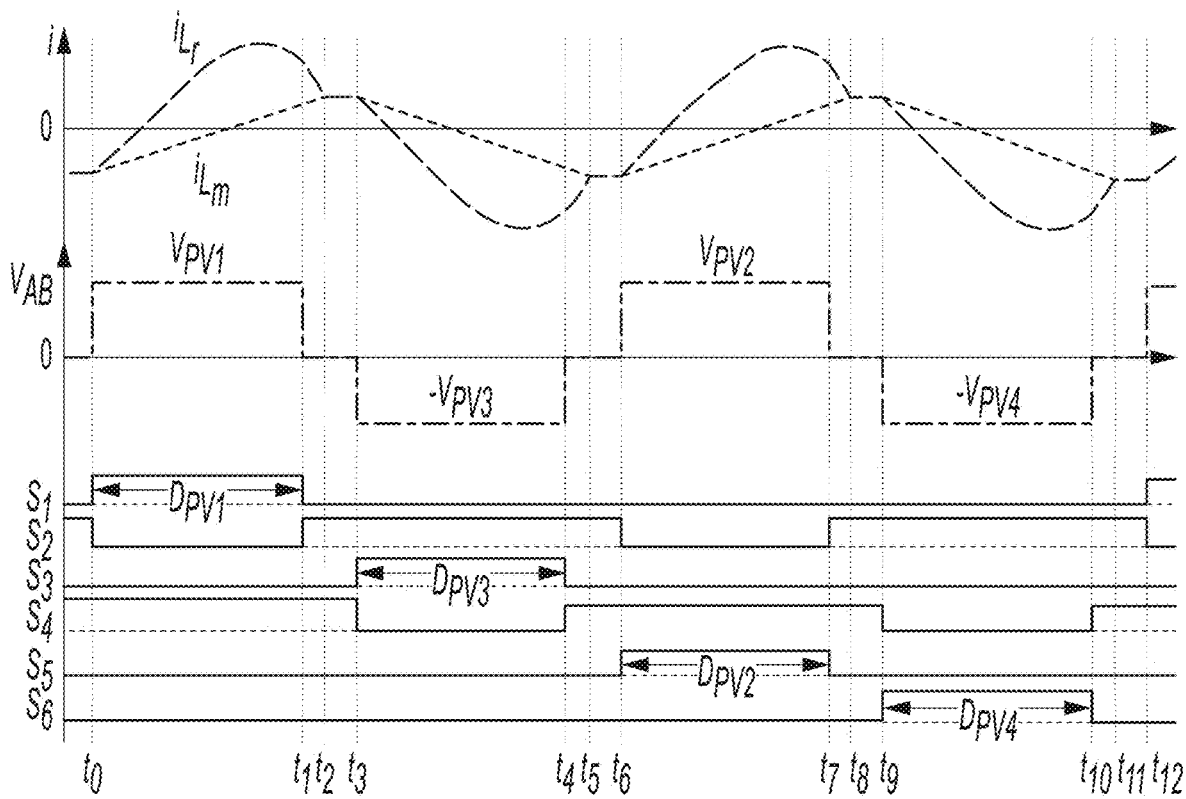
FIG. 5C shows example operating waveforms for the quad PV-input LLC DC-DC converter shown in FIG. 5A plotting current as a function of time for the switches $S_1$ to $S_6$, the voltage across the LLC resonant tank for shown as $V_{AB}$, and the inductor current through Lm and Lr.

FIG. 5C shows example operating waveforms for the quad PV-input LLC DC-DC converter 550 shown in FIG. 5A plotting current as a function of time for the switches $S_1$ to $S_6$, the voltage across the LLC resonant tank for 425 shown as $V_{AB}$, and the inductor current through Lm and Lr. The contribution is the quad PV-input LLC converter 550 and the quad independent MPPT control capability using the PWM duty cycle of the switches $S_1$, $S_3$, $S_5$, and $S_6$.

Figure 5D:
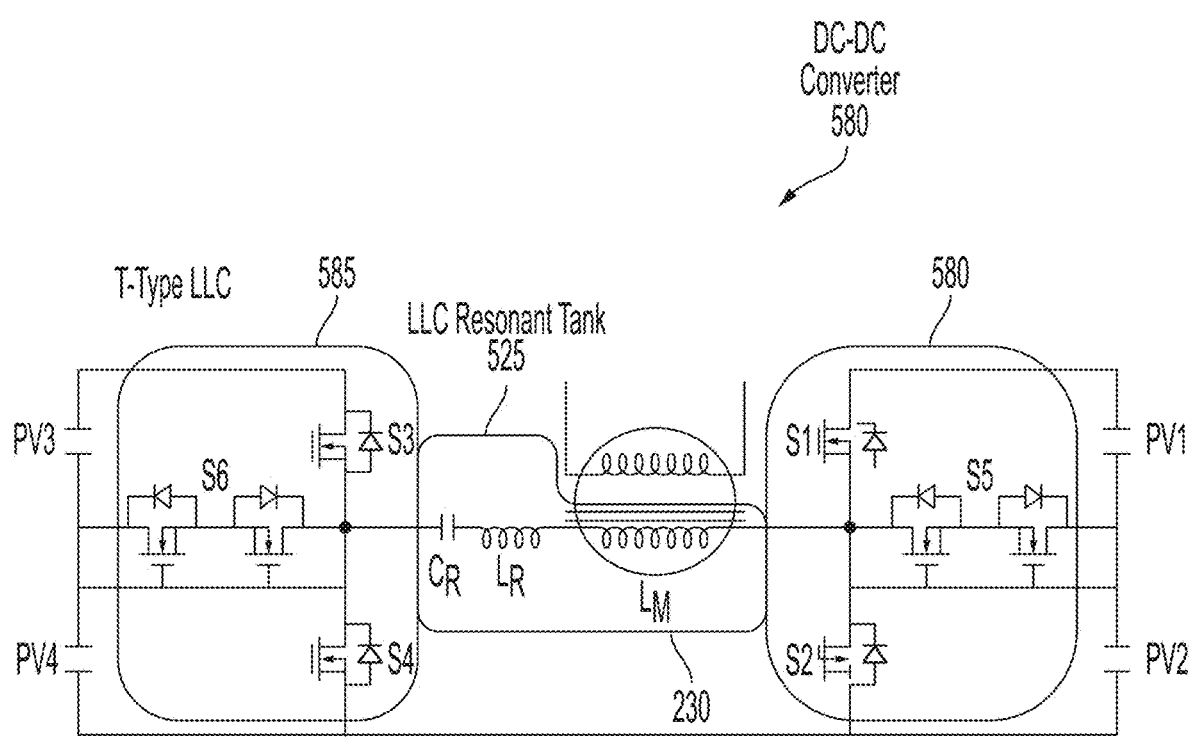
FIG. 5D shows a circuit diagram for another disclosed quad PV-input DC-DC converter topology having 6 switches $S_1$ to $S_6$ that uses only two bidirectional switches.

Another disclosed quad PV-input DC-DC converter topology having 6 switches $S_1$ to $S_6$ that uses only two bidirectional switches (shown as $S_5$ and $S_6$) is shown as DC-DC converter 580 in FIG. 5D. This topology maybe referred to as a "T-type quad-input LLC converter". A rectifier coupled to the secondary side of the transformer 230 is not shown. The operating modes of this DC-DC converter 580 is the same as described above for DC-DC converter 550 and DC-DC converter 570.

Figure 6:
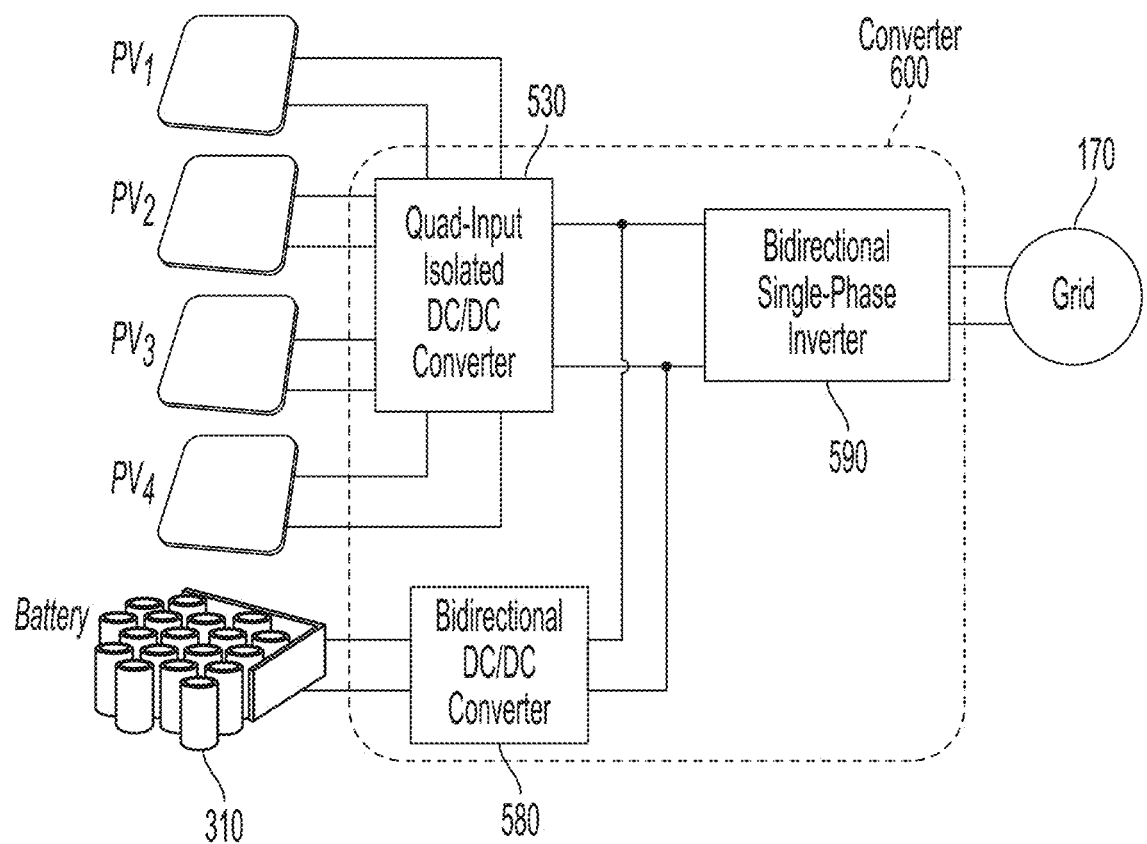
FIG. 6 shows a system level block diagram representation of a grid-connected dual-input single resonant tank DC-DC converter having a battery for power storage.

FIG. 6 shows a block diagram representation of a system 600 including a disclosed single resonant tank LLC DC-DC converter 530 with a disclosed architecture configured to receive power from 4 PV panels shown as $PV_1$ to $PV_4$, which further includes a battery 310 for power storage. The disclosed quad input isolated DC/DC converter 530 comprises six switches as with the half-bridge circuits 510 and 515 together shown in FIG. 5A are used to connect to the four PV panels, while a bidirectional DC/DC converter 580 is provided to receive power from or provide power to the battery 310. A bidirectional single-phase inverter 590 is shown coupled to the output of the quad input isolated DC/DC converter 530 and the output of the bidirectional DC/DC converter 580, where the output of the bidirectional single-phase inverter 590 is connected to the power grid 170.

EXAMPLES

Disclosed embodiments are further illustrated by the following specific Examples, which should not be construed as limiting the scope or content of this Disclosure in any way.

A 500-W dual PV-input LLC resonant power DC-DC converter prototype based on dual-input single resonant tank DC-DC converter 250 shown in FIG. 2C was built to validate the operating principle and performance of the power converter. The prototype specifications were as follows: input voltage Vin=25 to 50 V (provided by each of the $PV_1$ and $PV_2$ panels), output voltage Vo=220 V, rated output power Po=500 W (250 W provided by each PV panel), fs=50 to 180 kHz, resonant frequency fr=100 kHz, resonant inductor Lr=3.2 µH, resonant capacitor Cr=0.8 µF, magnetizing inductor Lm=12 µH, and the transformer's 230 turns ratio n=5.6. The switches $S_1$ to $S_4$ were operated in complementary PWM mode with a 50% duty cycle, and the dead time was 100 ns.

Three typical cases summarized in Table I copied below were analyzed to verify the performance of the disclosed DC-DC power converter when MPPT is independently implemented for each PV panel. The two control variables, fs and Φ were calculated based on a numerical time-domain analysis. Fundamental harmonic analysis (FHA) is generally used for LLC converters to calculate power and voltage. This method is an approximate method that is not accurate enough for some cases. Time-domain analysis is a more complicated but accurate method that was used in this characterization work. In this method, the resonant tank's voltage and current were calculated in each mode of operation to form a closed-loop calculation. This method calculates the frequency and the phase shift with the given PVs' voltages and powers. The calculated values were compared with the experimental results obtained at the same operating parameters to validate the accuracy of the analysis.

Figure 7A:
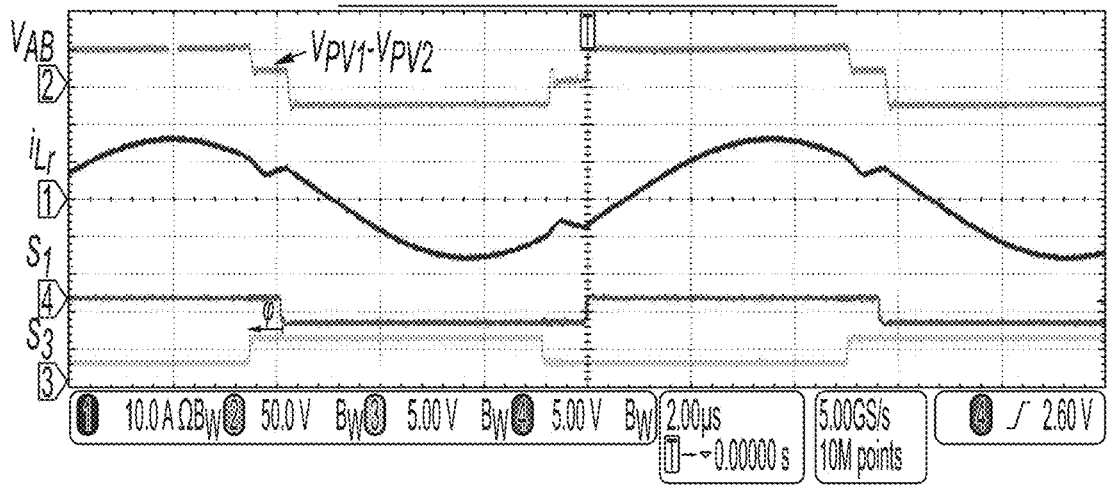
FIG. 7A-C show example operating waveforms for the resonant tank voltage (VAB), inductor resonant current (iLr) and switching waveforms ($S_1$ and $S_3$) for an example dual-input single LLC resonant tank DC-DC converter for three cases shown as (A) case 1, (B) case 2, and (C) case 3.
Figure 7B:
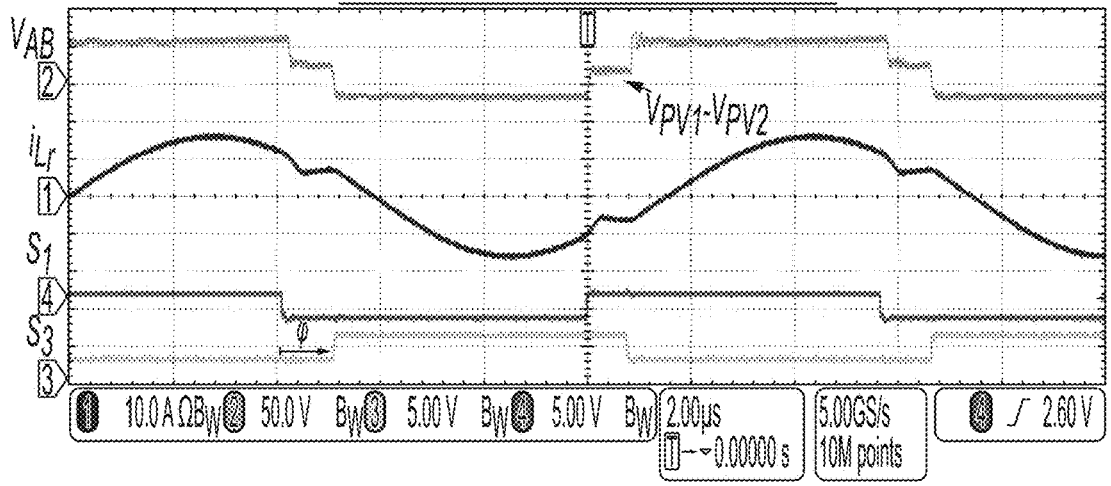
Figure 7C:
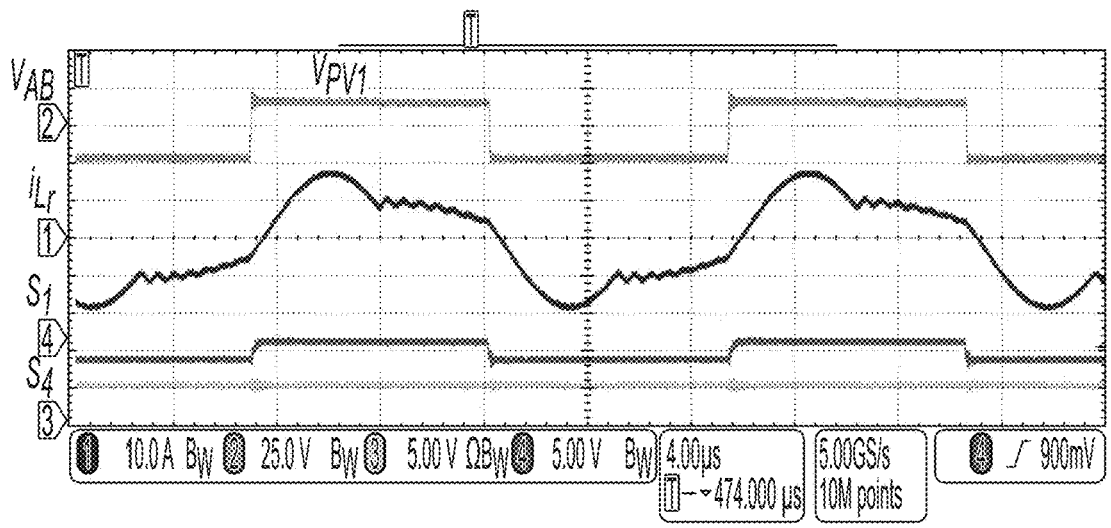

FIG. 7A-C shows the resonant tank voltage (VAB), inductor resonant current (iLr) and switching waveforms ($S_1$ and $S_3$) for the three cases. In case 1 shown in FIG. 7A, determined by the MPPT control, $PV_1$ is operating at 45 V with 200 W of available power. $PV_2$ is operating at 30 V with 100 W of available power. In this case 1, in order to implement independent MPPT for each PV panel, the fs and Φ were selected to be 87 kHz and −15 degrees, respectively. The DC-DC converter output voltage was regulated at 220 V by the inverter stage Bus Voltage Regulator (BVR) which is a controller implemented in the inverter stage to regulate the DC link voltage. FIG. 7A shows the experimental switching waveforms of case 1 with a negative phase shift.

TABLE I

| CONVERTER PROTOTYPE OPERATING PARAMETERS | | | | | | |
|---|---|---|---|---|---|---|
| | Case 1 | | Case 2 | | Case 3 | |
| | $PV_1$ | $PV_2$ | $PV_1$ | $PV_2$ | $PV_1$ | $PV_2$ |
| Voltage | 45 V | 30 V | 35 V | 40 V | 40 V | OC. |
| Power | 200 W | 100 W | 115 W | 185 W | 200 W | 0 W |
| | Exp. | Cal. | Exp. | Cal. | Exp. | Cal. |
| Frequency | 87 kHz | 89 kHz | 87 kHz | 89 kHz | 56 kHz | 57 kHz |
| Phase Shift | −15° | −17° | +29° | +29° | 0° | |
| Efficiency | 94.5% | | 95% | | 95.5% | |

Referring to FIG. 7A, due to the voltage difference between the two PV panels and the PWM phase shift of each PV panel, the resonant tank voltage is not symmetrical over one switching cycle. Despite the asymmetric tank voltage, the inductor resonant current is symmetric and the DC-DC power converter was found to operate at a power efficiency of 94.5%.

In the second case, $PV_1$ operates at 35 V with 115 W of available power, and $PV_2$ operates at 40 V with 185 W of available power. The operating frequency and PWM phase shift were set at 87 kHz and +29 degrees, respectively, with measured power efficiency of 95%. It is noted that the DC-DC power converter output voltage is maintained at 220 V by the BVR. The experimental switching waveforms with positive phase shift are shown in FIG. 7B which corresponds to predicted waveforms. Any DC voltage mismatch between the two PV panels is blocked by the resonant capacitor (see $C_R$ in FIG. 2C) and thus does not adversely affect the operation of the DC-DC power converter. In both case 1 and case 2, the combined power from the two PV panels is 300 W. Therefore, the DC-DC power converter's operating frequency (fs) remained constant as expected. However, Φ varies with each PV panel's contribution to the total power.

In case 3, $PV_2$ is disconnected and $PV_1$ is supplying power to the load. Therefore, in this case, $S_3$ is OFF and $S_4$ is ON, and the LLC resonant tank 225 is operating in half-bridge configuration as shown in FIG. 7C. The available input power and voltage are 200 W and 40 V, respectively. The output voltage was 220 V as in case 1 and case 2, and the DC-DC power converter operated at 56 kHz. Power efficiency was measured at 95.5%. It is noted that in all of the experimental results, the selected values of fs and Φ are in close agreement with the calculated values. Therefore, the experimental results validate the numerical time-domain analysis performed to verify the effectiveness of fs and Φ control on power contribution of each PV panel. Referring to FIG. 7A-C, ZVS is achieved for $S_1$ in all three cases since the resonant current is negative prior to turning ON $S_1$. This negative direction of current forces the body diode D1 of $S_1$ to conduct during the dead time and provide zero voltage across $S_1$. The same is true for $S_3$.

Figure 8A:
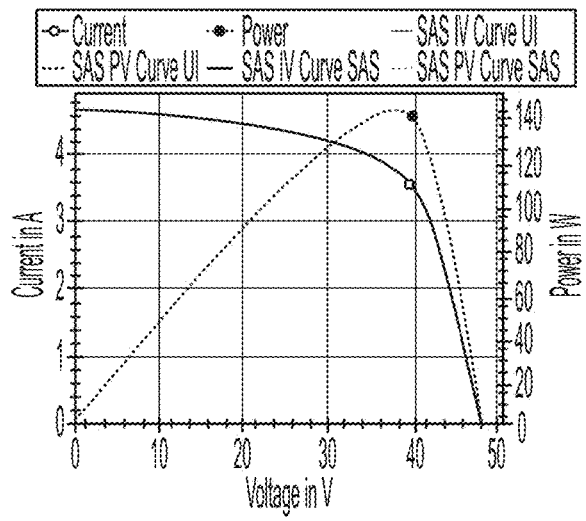
FIGS. 8A-C and FIGS. 9A-C show the dynamic response of the MPPT controller when power from $PV_2$ decreases from 140 W to 100 W, while $PV_1$ is operating at the same condition (140 W).
Figure 8B:
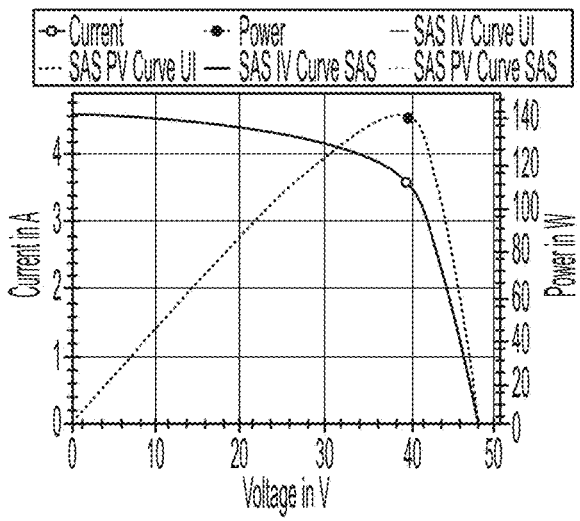
Figure 8C:
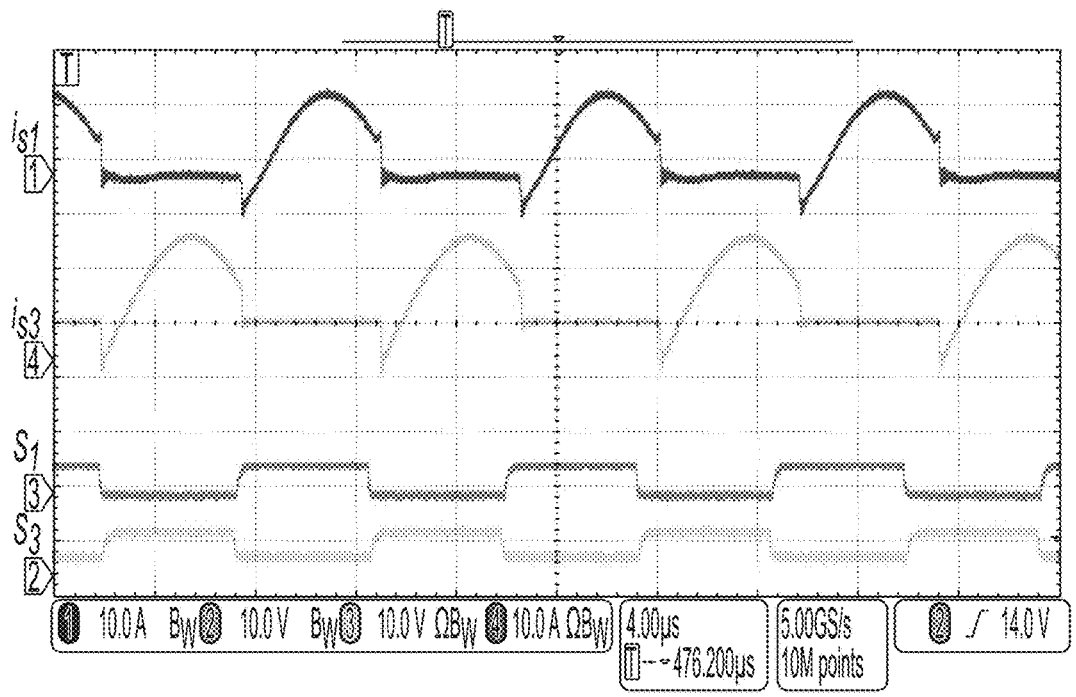

To demonstrate the control loop dynamic response, two solar array simulators with interface software were used to produce a dynamic change in PV power. FIGS. 8A-C and FIGS. 9A-C show the dynamic response of the MPPT controller when power from $PV_2$ decreases from 140 W to 100 W, while $PV_1$ is operating at the same condition (140 W). FIG. 8A and FIG. 8B shows operating waveforms for two identical PV sources producing 140 W before the dynamic change. It is noted that there is no phase shift since the power is balanced between the two PV panels. Therefore, the MPPT controller only perturbs frequency to locate the maximum power point for the PV panel. The DC-DC power converter is operating at 93 kHz with zero phase shift. After the dynamic change in $PV_2$'s power when its power decreases from 140 W to 100 W, the MPPT controller starts adjusting the switching frequency and phase shift to locate the maximum power point.

Figure 9A:
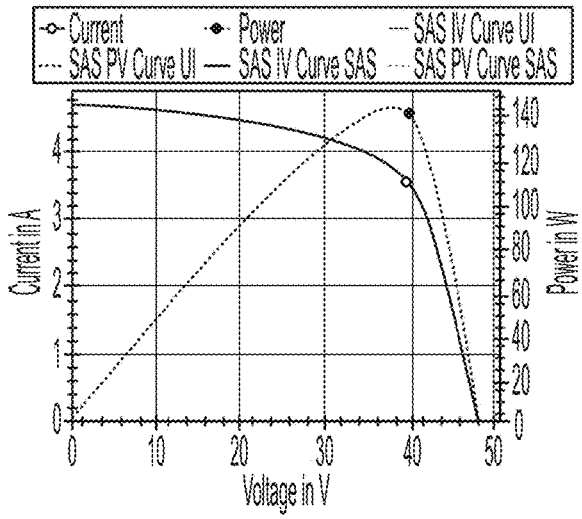
Figure 9B:
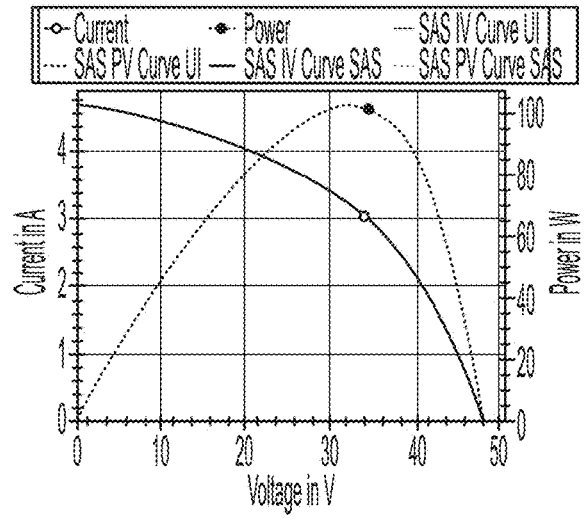
Figure 9C:
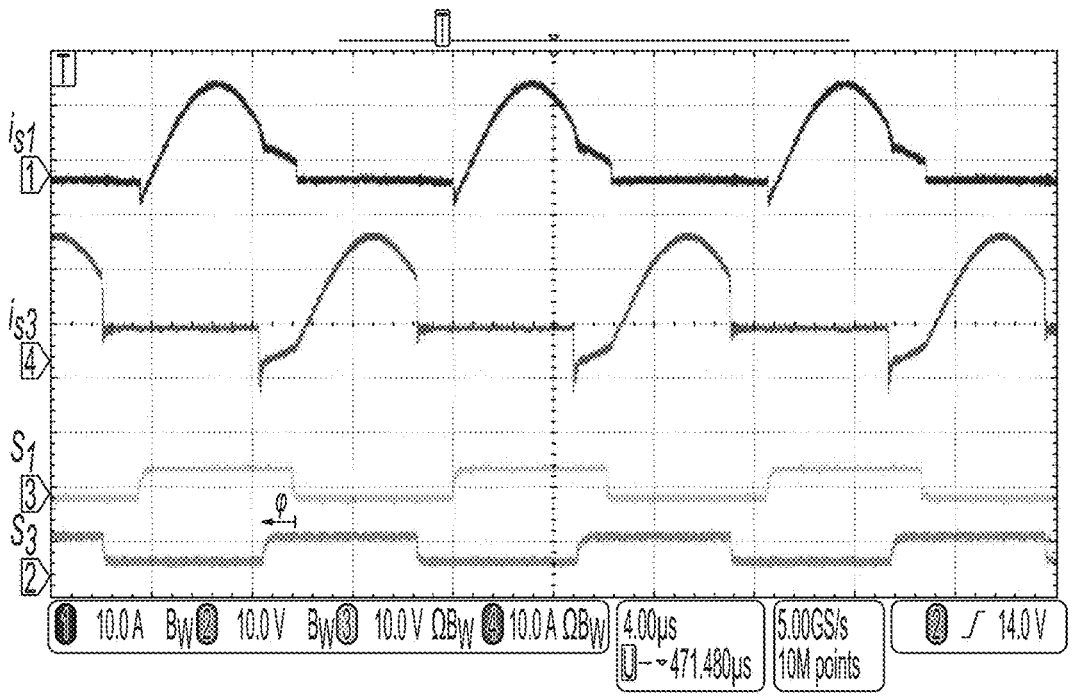

FIG. 9A-C show operating waveforms for two PV sources one of which is operating at 140 W and the other operating at 100 W. It can be seen that the operating parameters of $PV_2$ has changed because the MPPT controller has changed the switching frequency and phase shift after the dynamic change in order to locate the maximum power point. The MPPT controller adjusted the switching frequency and phase shift at 80 kHz and −34 degrees, respectively. The MPPT controller is now introducing phase shift to compensate for this power mismatch, and perturbs the frequency and the phase shift at a time to locate the maximum power point. It can be seen that MPPT is achieved for both PV panels.

Figure 10:
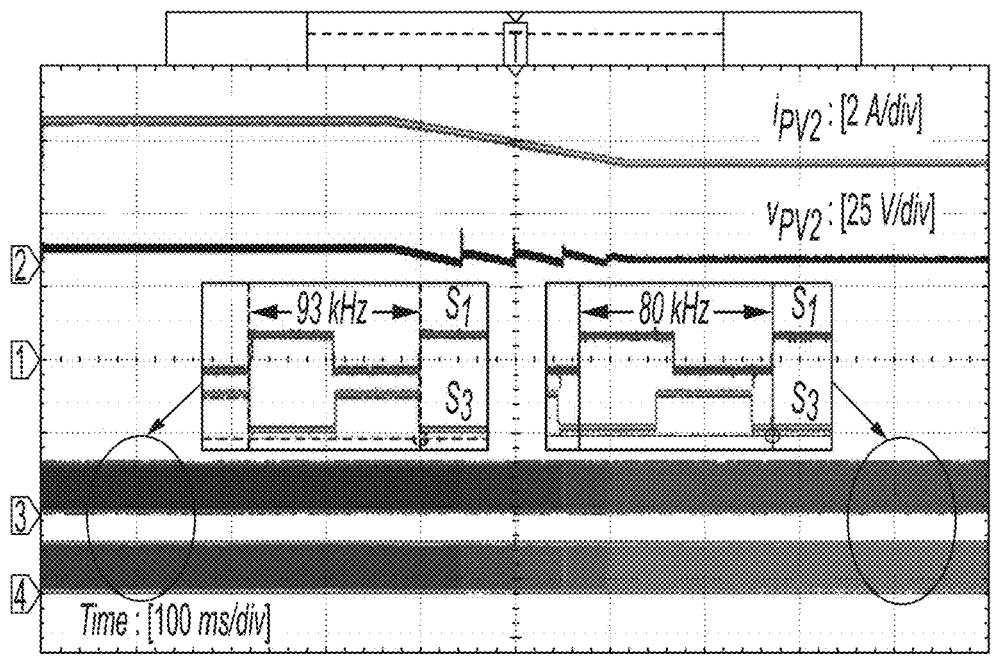
FIG. 10 shows $PV_2$'s voltage and current before and after the dynamic change in power from 140 W to 100 W. The switching waveforms are also depicted during this dynamic change along with the extended views.
Figure 11:
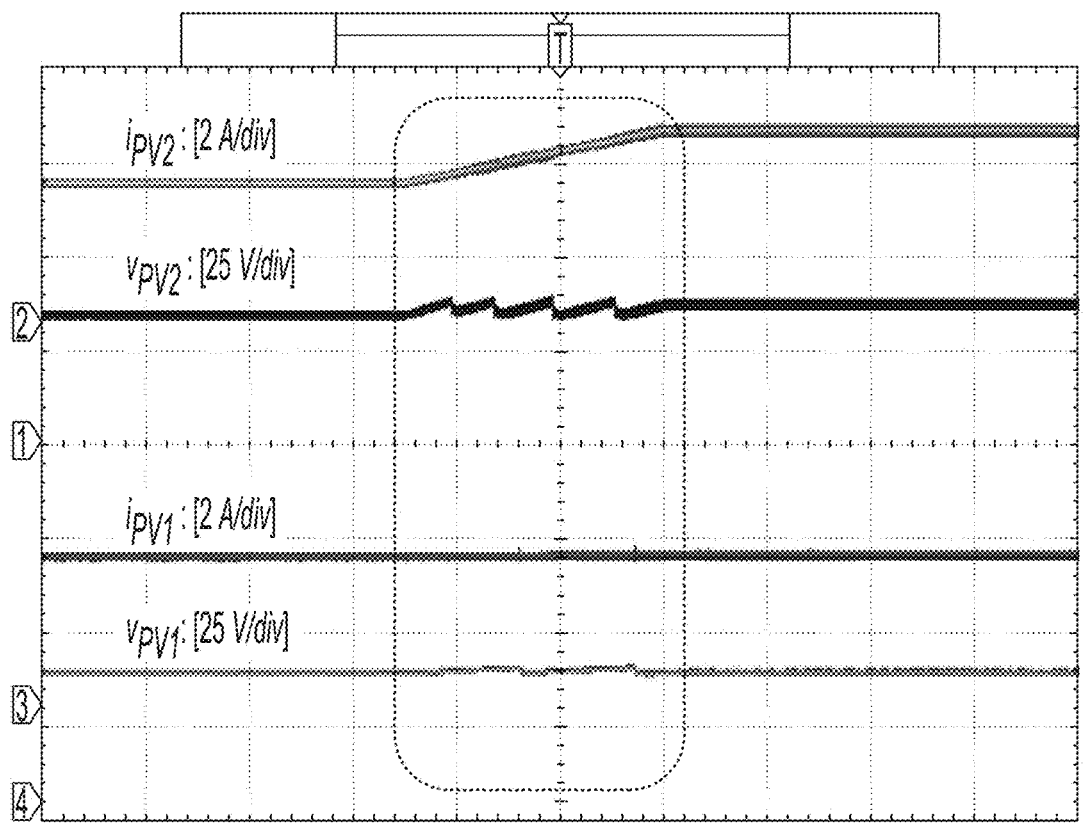
FIG. 11 shows both PVs' voltages and currents during the dynamic change. It can be seen that power changes on one PV panel will not adversely impact on the operation of the other PV panel.

FIG. 10 shows $PV_2$'s voltage and current before and after the dynamic change in power from 140 W to 100 W. The switching waveforms are also depicted during this dynamic change along with the extended views. It can be seen that it takes several steps for the MPPT controller to adjust the switching frequency and phase shift in locating the maximum power point for the PV panels during the dynamic change. FIG. 11 shows both PVs' voltages and currents during the dynamic change. It can be seen that power changes on one PV panel will not adversely impact on the operation of the other PV panel.

Figure 12:
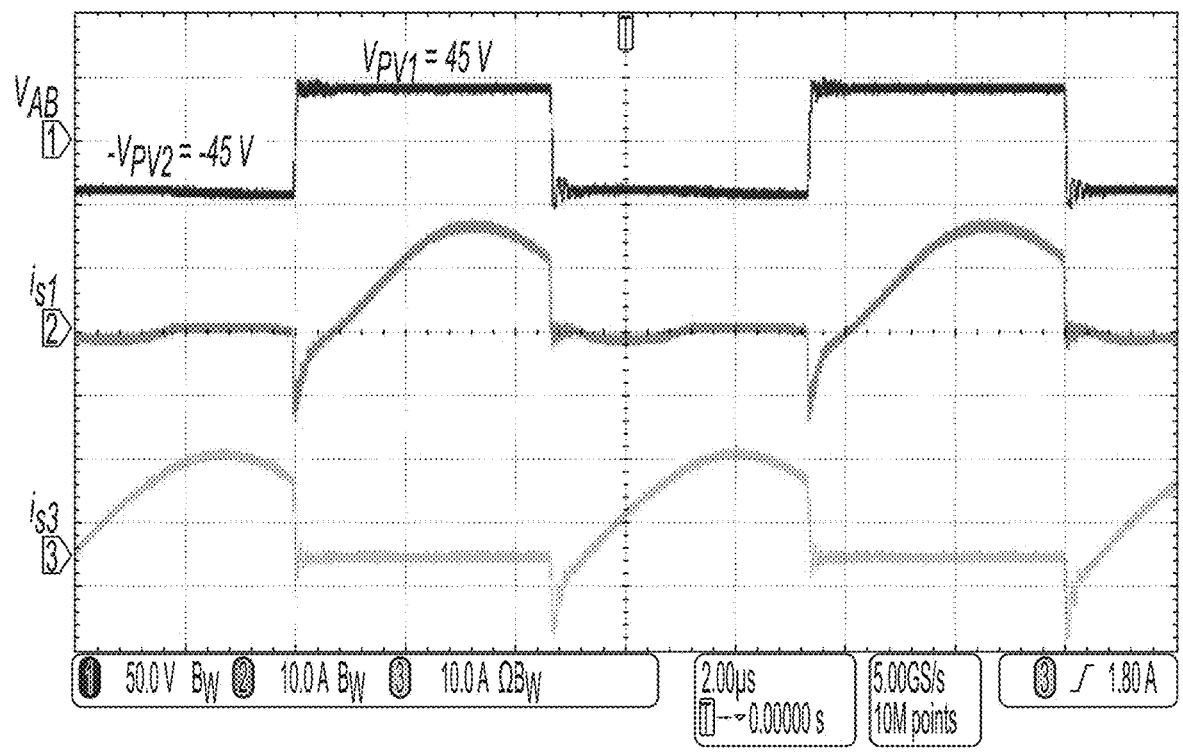
FIG. 12 shows with the DC-DC converter operating at 400 W with each source supplying 200 W evidencing when the power is shared equally between the two PV panels, the 1 is zero and switch currents are symmetrical as one would expect to see in a typical LLC resonant converter with a single source voltage.
Figure 13:
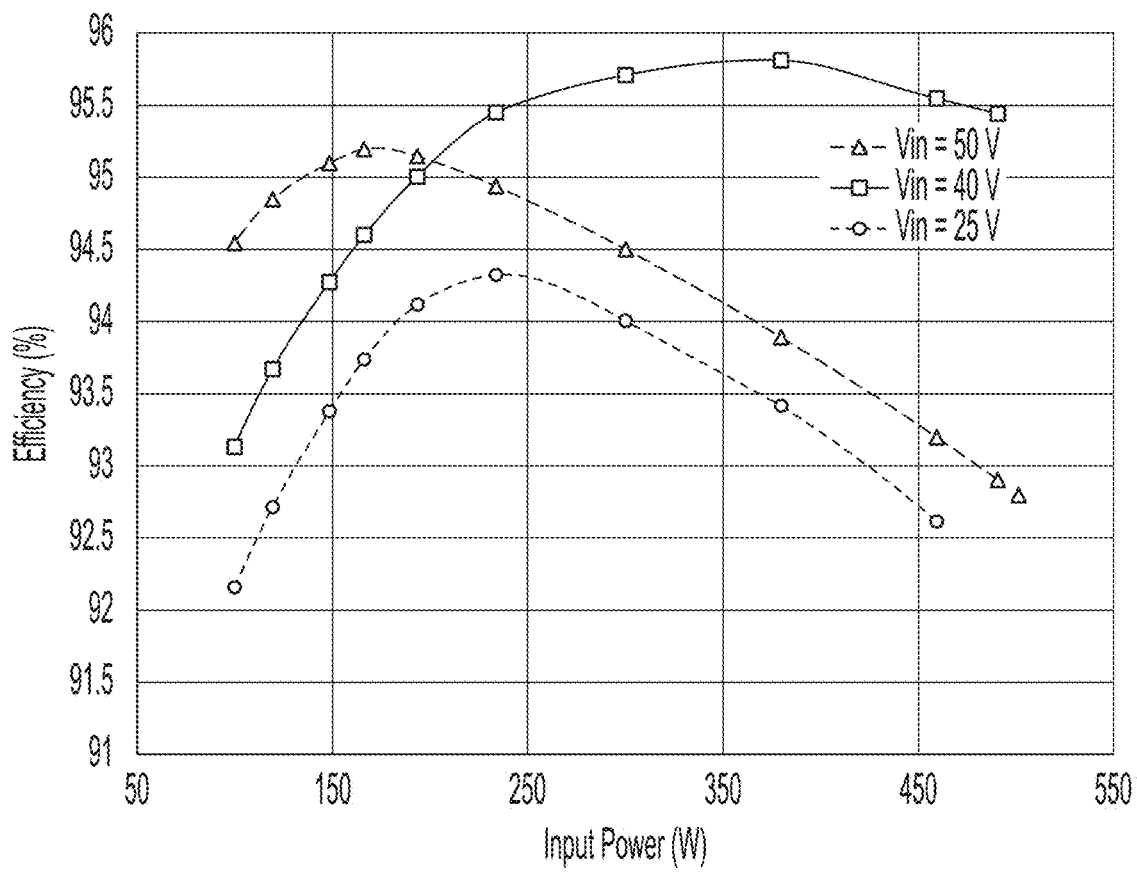
FIG. 13 shows the DC-DC converter power efficiency versus input power from the two PV sources at different input voltages with no voltage mismatch between the two PV panels. The PWM phase shift of each PV panel is set at zero degrees (Φ=0; being the phase shift between the two half-bridge legs (the two switches for each source is zero), thereby each PV panel generates half of the input power.

When the power is shared equally between the two PV panels, the 1 is zero and switch currents are symmetrical as one would expect to see in a typical LLC resonant DC-DC converter with a single source voltage. An example of this is shown in FIG. 12 with the DC-DC converter operating at 400 W with each source supplying 200 W. FIG. 13 shows the DC-DC converter power efficiency versus input power from the two PV sources at different input voltages with no voltage mismatch between the two PV panels. The PWM phase shift of each PV panel is set at zero degrees (so that Φ=0), thereby each PV panel generates half of the input power. At nominal PV input voltage of 40 V, the peak power efficiency of 95.8% is achieved while the switching frequency is equal to the resonant frequency of 100 kHz. At 50 V, switching losses are dominant since the switching frequency reaches as high as 180 kHz. Power efficiency is lowest at input voltage of 25 V as a result of increased conduction loss while the DC-DC converter is operating at 60 kHz. The LLC control bandwidth is far greater than that of the MPPT control bandwidth. Therefore, there is little interaction between the two controllers, and MPPT will dominate. Even though this disclosed topology supports two PV panels, it can operate with one PV source in the event that one PV panel fails. A benefit of this disclosed topology as described above is that it eliminates one dedicated microinverter (a DC/DC converter and a DC/AC inverter) that would be required for the second PV panel, thereby reducing cost, size and weight, while improving reliability.

The main advantage of disclosed DC-DC power converters compared to two independent isolated DC/DC converters such as based on LLC, dual active bridge (DAB), or flyback being common isolated DC/DC converters, such as shown in FIG. 1A is the reduced number of components which results in reduced cost and improved reliability. For example, two independent LLC resonant DC-DC converters can simply implement MPPT for two PV panels at the cost of increased number of components since two LLC resonant tanks would be required. In addition, either two two-winding transformers or one three-winding transformer would be required when two independent LLC DC-DC converters are used. Disclosed DC-DC power converters having a single LLC resonant tank 225 combined with the disclosed dual output MPPT controller allows connecting two PV panels and implementing an independent MPPT function for each PV panel with a minimum number of components.

While various disclosed embodiments have been described above, it should be understood that they have been presented by way of example only, and not as a limitation. Numerous changes to the disclosed embodiments can be made in accordance with the Disclosure herein without departing from the spirit or scope of this Disclosure. Thus, the breadth and scope of this Disclosure should not be limited by any of the above-described embodiments. Rather, the scope of this Disclosure should be defined in accordance with the following claims and their equivalents. For example, any one or more of the PV panels can be replaced by battery(ies).

Although disclosed embodiments have been illustrated and described with respect to one or more implementations, equivalent alterations and modifications will occur to others skilled in the art upon the reading and understanding of this specification and the annexed drawings. While a particular feature may have been disclosed with respect to only one of several implementations, such a feature may be combined with one or more other features of the other implementations as may be desired and advantageous for any given or particular application.

The invention claimed is:

1. A multi-input DC-DC power converter, comprising:
a first bridge circuit configured for receiving power from a first electric power source, the first bridge circuit comprising a first pair of power switches with a first switch output node (node A) in between, and a second bridge circuit configured for receiving power from a second electric power source comprising a second pair of power switches with a second switch output node (node B) in between; wherein at least one of the first electric power source and second electric power source comprise a photovoltaic (PV) panel;
a single LLC resonant tank coupled to both the node A and the node B including a first inductor ($L_r$) and a capacitor (Cr) configured together with a transformer comprising a secondary winding and a primary winding that provides a magnetizing inductance which provides a second inductance (Lm) for the single LLC resonant tank,
wherein at least two of the $L_r$, the $C_r$, and the $L_m$ of the single LLC resonant tank are coupled between the node A and the node B, and
a rectifier coupled to the secondary winding.

2. The DC-DC power converter of claim 1, wherein the $C_r$ is on the primary winding side of the transformer.

3. The DC-DC power converter of claim 1, wherein the $C_r$ is on the same side of the transformer as the secondary winding.

4. The DC-DC power converter of claim 1, wherein the coupling of the single LLC resonant tank to the node A and the node B is a direct coupling.

5. The DC-DC power converter of claim 1, wherein the first bridge circuit and the second bridge circuit both comprise half-bridge circuits which share a common ground.

6. The DC-DC power converter of claim 1, wherein the first electric power source comprises a first PV panel and wherein the second electric power source comprises a second PV panel;
further comprising a maximum power point tracking (MPPT) controller coupled to a pulse width modulation (PWM) generator coupled to the first for implementing PWM phase shift control to independently provide MPPT for the first PV panel and the second PV panel, wherein the MPPT controller is coupled to an output of the first PV panel and the second PV panel, and wherein the PWM generator is coupled to switches of the first bridge circuit and switches of the second bridge circuit.

7. The DC-DC power converter of claim 1, wherein the first electric power source or the second electric power source comprises a battery.

8. The DC-DC power converter of claim 1, wherein the first bridge circuit and the second bridge circuits both include at least one bidirectional switch.

9. The DC-DC power converter of claim 1, wherein the rectifier comprises a full bridge rectifier.

10. A method of power conversion, comprising:
coupling an output from a plurality of electric power sources including a first photovoltaic (PV) panel and a second PV panel, with an output of the first PV panel coupled to a first bridge circuit and an output of the second PV panel coupled to a second bridge circuit, wherein the bridge circuits both have output nodes coupled to a single LLC resonant tank including a first inductor (Lr), a capacitor (Cr) configured together with a transformer comprising a secondary winding and a primary winding that has a magnetizing inductance which that provides a second inductor (Lm) in series with the Lr and the Cr, wherein the primary winding is coupled between an output node of the first bridge circuit (node A) and the second bridge circuit (node B), and a rectifier is coupled to the secondary winding that provides a DC output, and
controlling power from each of the first and second PV panels using a power controller coupled to the output of the first and second PV panels and switches of the first and second bridge circuits implementing pulse width modulation (PWM) phase shift control to independently implement maximum power point tracking (MPPT) for the first PV panel and the second PV panel.

11. The method of power conversion of claim 10, wherein the first bridge circuit and the second bridge circuit both comprise half-bridge circuits which share a common ground.

12. The method of power conversion of claim 10, further comprising a DC/AC converter coupled to an output of the rectifier for providing an alternating current (AC) output to a power grid.

13. The method of claim 10, wherein the plurality of electric power sources include at least one battery.

14. The method of claim 10, wherein the switches of the first and second bridge circuits both include at least one bidirectional switch.

15. The method of claim 10, wherein the power controller comprises a maximum power point tracking (MPPT) controller coupled to a pulse width modulation (PWM) generator, wherein the PWM generator outputs two pairs of PWM signals, one pair of PWM signals for two switches connected to the first PV panel, and another pair of PWM signals for two switches connected to the second PV panel.

16. The method of claim 15, wherein the pair of PWM signals are phase shifted relative to one another.

* * * * *